United States Patent
Kang et al.

(10) Patent No.: US 7,098,131 B2
(45) Date of Patent: Aug. 29, 2006

(54) METHODS FOR FORMING ATOMIC LAYERS AND THIN FILMS INCLUDING TANTALUM NITRIDE AND DEVICES INCLUDING THE SAME

(75) Inventors: Sang-Bom Kang, Seoul (KR); Byung-Hee Kim, Seoul (KR); Kyung-In Choi, Seoul (KR); Gil-Heyun Choi, Gyeonggi-do (KR); You-Kyoung Lee, Chungchoungbuk-do (KR); Seong-Geon Park, Gyeonggi-do (KR)

(73) Assignee: Samsung Electronics Co., Ltd., (KR)

( * ) Notice: Subject to any disclaimer, the term of this patent is extended or adjusted under 35 U.S.C. 154(b) by 0 days.

(21) Appl. No.: 10/856,627

(22) Filed: May 28, 2004

(65) Prior Publication Data

US 2004/0219784 A1 Nov. 4, 2004

Related U.S. Application Data

(63) Continuation-in-part of application No. 10/196,814, filed on Jul. 17, 2002, now abandoned.

(30) Foreign Application Priority Data

Jul. 19, 2001 (KR) .............................. 2001-43526
Mar. 29, 2002 (KR) .............................. 2002-17479
May 29, 2003 (KR) .................... 10-2003-0034352

(51) Int. Cl.
*H01L 21/4763* (2006.01)

(52) U.S. Cl. .................. 438/648; 438/620; 438/627; 438/628; 438/629; 438/685; 438/653; 438/656; 438/681

(58) Field of Classification Search ............... 438/627, 438/628, 629, 648, 685, 653, 656, 657, 681, 438/650, 680; 257/E23.163, E21.463, E21.168, 257/E21.295
See application file for complete search history.

(56) References Cited

U.S. PATENT DOCUMENTS

| 5,668,054 A | 9/1997 | Sun et al. |
|---|---|---|
| 6,153,519 A | 11/2000 | Jain et al. |
| 6,203,613 B1 | 3/2001 | Gates et al. |

(Continued)

FOREIGN PATENT DOCUMENTS

JP        2002-193981 A       7/2002

(Continued)

*Primary Examiner*—George Fourson
*Assistant Examiner*—Julio J. Maldonado
(74) *Attorney, Agent, or Firm*—Myers Bigel Sibley & Sajovec, P.A.

(57) ABSTRACT

Atomic layers can be formed by introducing a tantalum amine derivative reactant onto a substrate, wherein the tantalum amine derivative has a formula: $Ta(NR_1)(NR_2R_3)_3$, wherein $R_1$, $R_2$ and $R_3$ are each independently H or a $C_1$–$C_6$ alkyl functional group, chemisorbing a portion of the reactant on the substrate, removing non-chemisorbed reactant from the substrate and introducing a reacting gas onto the substrate to form a solid material on the substrate. Thin films comprising tantalum nitride (TaN) are also provided.

25 Claims, 11 Drawing Sheets

U.S. PATENT DOCUMENTS

| | | |
|---|---|---|
| 6,204,204 B1 | 3/2001 | Paranjpe et al. |
| 6,319,567 B1* | 11/2001 | Senzaki et al. ............. 427/565 |
| 6,482,733 B1* | 11/2002 | Raaijmakers et al. ....... 438/633 |
| 6,593,484 B1 | 7/2003 | Yasuhara et al. |
| 6,653,199 B1* | 11/2003 | Zheng ........................ 438/398 |
| 2002/0076490 A1* | 6/2002 | Chiang et al. ............ 427/248.1 |
| 2002/0104481 A1* | 8/2002 | Chiang et al. ........ 118/723.001 |
| 2002/0182320 A1 | 12/2002 | Leskela et al. |
| 2003/0017697 A1 | 1/2003 | Choi et al. |
| 2003/0027431 A1 | 2/2003 | Sneh et al. |
| 2003/0072975 A1* | 4/2003 | Shero et al. ................ 428/704 |

FOREIGN PATENT DOCUMENTS

| | | |
|---|---|---|
| KR | 2003-0009093 A | 1/2003 |

\* cited by examiner

METHODS FOR FORMING ATOMIC LAYERS AND THIN FILMS INCLUDING TANTALUM NITRIDE AND DEVICES INCLUDING THE SAME

RELATED APPLICATIONS

This application is a continuation-in-part of U.S. patent application Ser. No. 10/196,814, filed Jul. 17, 2002 now abandoned, which claims the benefit of Korean Patent Application Nos. 2001-43526, filed Jul. 19, 2001 and 2002-17479, filed Mar. 29, 2002. This application also claims the benefit of Korean Patent Application No. 2003-34352, filed May 29, 2003, the disclosures of which are hereby incorporated herein by reference in their entirety as if set forth fully herein.

FIELD OF THE INVENTION

The present invention relates to methods of forming atomic layers and thin films, and more particularly, methods of forming atomic layers and thin films using metallic precursors.

BACKGROUND OF THE INVENTION

It is desirable for metal layers used for metal lines on semiconductor devices to be compatible in various structured forms. To increase the density of devices formed on a semiconductor substrate, a metal layer can be formed as a multi-layered structure. The metal layer can include, for example, aluminum or tungsten. However, the specific resistance of aluminum is about $2.8 \times 10E-8 \Omega m$ and the specific resistance of tungsten is about $5.5 \times 10E-8 \Omega m$. Thus, aluminum and tungsten are typically unsuitable for a multi-layer structure. Consequently, copper, which has relatively low specific resistance and good electromigration characteristics, is often used as a metal layer of a multi-layered structure.

Copper can exhibit a very high mobility when compared to silicon and silicon oxide. However, copper can easily be oxidized when it reacts with silicon and silicon oxide. Accordingly, it may be desirable to suppress the oxidization of copper by using a barrier metal layer.

A titanium nitride layer has been used as a barrier metal layer. However, the titanium nitride layer may not be suitable as a barrier metal layer for copper where the titanium nitride layer is desired to have a thickness above 30 nm to restrain the mobility of copper. Since the titanium nitride layer has a resistance proportional to the thickness thereof and a high reactivity, the resistance may be highly increased when the titanium nitride layer has a thickness above 30 nm.

For at least this reason, a tantalum nitride layer is suggested for the barrier metal layer where a tantalum nitride layer may restrain the mobility of copper even when the tantalum nitride layer is thin and has low resistance. Additionally, the tantalum nitride layer may exhibit a suitable step coverage characteristic and a suitable gap-filling property so that the tantalum nitride layer can also be used as a metal plug, a metal wiring, a metal gate, a capacitor electrode and/or the like, in addition to the barrier metal layer. Examples of tantalum nitride layers that can be used as barrier metal layers are disclosed in U.S. Pat. No. 6,204,204 (issued to Paranjpe et. al.), U.S. Pat. No. 6,153,519 (issued to Jain et. al.), and U.S. Pat. No. 5,668,054 (issued to Sun et. al.).

According to the disclosure in U.S. Pat. No. 5,668,054, the tantalum nitride layer is deposited through a chemical vapor deposition process by using terbutylimido-tris-diethylamido-tantalum (($(NEt_2)_3Ta\!=\!Nbu^t$, hereinafter simply referred to as "TBTDET") as a reactant. The process is carried out at a temperature above about 600° C. If the process is carried out at a temperature of about 500° C., the specific resistance of the tantalum nitride layer may exceed 10,000 $\Omega$cm. In addition, since the above process is carried out at a relatively high temperature, the semiconductor device can be thermally damaged. Further, it can be difficult to achieve a tantalum nitride layer having the desired step coverage when a chemical vapor deposition process is used.

Recently, an atomic layer deposition (ALD) process has been suggested as a substitute for the chemical vapor deposition (CVD) process. The atomic layer deposition process can be carried out at a relatively low temperature as compared with a conventional thin film forming process and can achieve superior step coverage. Examples of the atomic layer deposition processes for depositing tantalum nitride are disclosed in U.S. Pat. No. 6,203,613 (issued to Gates) and in an article by Kang et al., entitled "Plasma-Enhanced Atomic Layer Deposition of Tantalum Nitrides Using Hydrogen Radicals as a Reducing Agent," *Electrochemical and Solid-State Letters,* 4(4) C17–19 (2001). As described in the Kang et al. article, a tantalum nitride layer having a specific resistance of about 400 cm, can be formed by an atomic layer deposition process using TBTDET. The deposition is carried out at a temperature of about 260° C. Accordingly, a thin film having a low specific resistance can be formed at a relatively low temperature. In addition, a hydrogen radical obtained by a plasma-enhanced process is used as a reducing agent. Therefore, a power source is applied into a chamber when the deposition is carried out. For this reason, the process described by Kang et al. presents process parameters that may be influenced by the power source applied to the chamber. Thus, while the Kang et al. process can be used to form a thin film having a low specific resistance at a relatively low temperature, the process parameters, which include control of the power source, are added. Moreover, because the Kang et al. process applies the power source directly to a predetermined portion of the chamber to which a semiconductor substrate is placed, the semiconductor substrate can be damaged by the power source.

An ALD process using a tantalum chloride ($TaCl_5$) source in tantalum nitride (TaN) thin film deposition is disclosed in an article by Mikko Ritala et al. entitled "Controlled Growth of TaN, $Ta_3N_5$ and TaOxNy Thin Films by Atomic Layer Deposition," *Chem. Mater.* 1999, 11, pp1712–1218. Additionally, a CVD process using a TBTDET source in TaN thin film deposition is disclosed in an article by Tsai MH et al. entitled "Metal organic chemical vapor deposition of Tantalum Nitride by Terbutyl-imidotris (Diethylamido) Tantalum for Advanced Metallization," *Applied Physics Letters,* V. 67 N. 8, 19950821.

However, the conventional TaN deposition process can exhibit several potential problems due to the potential problems associated with the sources. For example, the $TaCl_5$ source is generally a halogen source, and the halogen source is a solid state and has a high melting point. Therefore, when the $TaCl_5$ source is employed for the deposition process, particles can be generated and impurities, including chloride, may remain on the deposited TaN thin film which can induce additional problems. When a TBTDET source is used for the depositing process, the deposition rate can be too slow because of a low vapor pressure.

Japanese Laid-Open Patent No. 2002-193981 discloses a method of preparing tertiary amyl imido-tris-dimethylamido tantalum $(Ta(NC(CH_3)_2C_2H_5)(N(CH_3)_2)_3$, (hereinafter simply referred to as "TAIMATA") and a metal organic CVD (MOCVD) process using a solution including TAIMATA as a precursor. According to the method disclosed in Japanese Laid-Open Patent No. 2002-193981, 1 mole of $TaCl_5$, 4 moles of $LiNMe_2$ and 1 mole of LiNHtAm are reacted in an organic solvent at room temperature. The reaction product can be filtered and the solvent used can be removed to prepare TAIMATA. This material can be dissolved into an organic solvent, such as hexane, and thus, the solution obtained can be deposited onto a substrate in a CVD room to form a TaN thin film.

According to the above-described method, however, since the TaN thin film is formed by using only TAIMATA, the formation of the TaN thin film may be uncertain even though the preparation of TAIMATA may be advantageously carried out. When the deposition process is carried out onto the substrate by the CVD process using only TAIMATA, the vapor pressure may not be high enough and the process can be ineffective.

SUMMARY OF THE INVENTION

Embodiments of the present invention provide methods of forming atomic layers including introducing a tantalum amine derivative reactant onto a substrate, wherein the tantalum amine derivative has a formula: $Ta(NR_1)(NR_2R_3)_3$, wherein $R_1$, $R_2$ and $R_3$ are each independently H or a $C_1$–$C_6$ alkyl functional group, chemisorbing a portion of the reactant on the substrate, removing non-chemisorbed reactant from the substrate and introducing a reacting gas onto the substrate to form a solid material on the substrate.

In other embodiments, the present invention provides methods of forming thin films including (a) introducing a tantalum amine derivative reactant onto a substrate, wherein the tantalum amine derivative has a formula: $Ta(NR_1)$ $(NR_2R_3)$, wherein, $R_1$, $R_2$ and $R_3$ are each independently H or a $C_1$–$C_6$ alkyl functional group, (b) chemisorbing a portion of the reactant on the substrate, (c) removing non-chemisorbed reactant from the substrate, (d) introducing a reacting gas onto the substrate to form a solid material including tantalum nitride (TaN) on the substrate and (e) repeating steps (a) to (d) at least once to form a tantalum nitride (TaN) thin film including the solid material.

Further embodiments of the present invention provide methods of forming thin films including (a) forming an insulating layer on a substrate including therein an opening exposing a surface portion of the substrate, (b) introducing a tantalum amine derivative as a reactant onto the insulating layer having the opening, wherein the tantalum amine derivative has a formula: $Ta(NR_1)(NR_2R_3)$, wherein $R_1$, $R_2$ and $R_3$ are each independently H or a $C_1$–$C_6$ alky functional group, (c) chemisorbing a portion of the reactant on the insulating layer having the opening, (d) removing non-chemisorbed reactant from the insulating layer having the opening, (e) introducing a reacting gas onto the substrate to form a solid material including tantalum nitride (TaN) on the substrate and (f) repeating steps (b) to (e) at least once to form a tantalum nitride (TaN) thin film on the insulating layer having the opening.

Embodiments of the present invention can further provide methods of forming thin films including mixing a tantalum amine derivative having a formula: $Ta(NR_1)(NR_2R_3)$, wherein $R_1$, $R_2$ and $R_3$ are each independently H or a $C_1$–$C_6$ alkyl functional group, with a reacting gas comprising hydrogen ($H_2$), ammonia ($NH_3$), silane ($SiH_4$), disilane ($Si_2H_6$) or a combination thereof to form a mixture, and depositing the mixture on a substrate.

In other embodiments, the present invention provides methods of forming thin films including forming an insulating layer on a substrate including therein an opening exposing a surface portion of the substrate and introducing a tantalum amine derivative as a reactant onto the insulating layer having the opening with a reacting gas comprising hydrogen ($H_2$), ammonia ($NH_3$), silane ($SiH_4$), disilane ($Si_2H_6$) or combinations thereof to form a tantalum nitride (TaN) thin film, wherein the tantalum amine derivative has a formula $Ta(NR_1)(NR_2R_3)$, wherein $R_1$, $R_2$ and $R_3$ are each independently H or a $C_1$–$C_6$ alkyl functional group.

Additional embodiments of the present invention provide atomic layers and thin films formed by the methods provided herein. Further embodiments of the present invention provide semiconductor devices including the atomic layers and thin films provided herein.

BRIEF DESCRIPTION OF THE DRAWINGS

The above objects and advantages of the present invention will become more apparent by describing in detail embodiments of the present invention with reference to the attached drawings in which:

FIGS. 4A and 4B present graphs illustrating deposition rates with respect to temperature of a stage heater during deposition of TAIMATA by a chemical vapor deposition (CVD) process under an argon (Ar) atmosphere according to some embodiments of the present invention, wherein FIG. 4A is illustrated with a uniformity and FIG. 4B is illustrated with a specific resistance;

FIGS. 5A and 5B present graphs illustrating deposition rates with respect to temperature of a stage heater during deposition of a TAIMATA source by a CVD process while supplying an ammonia ($NH_3$) reacting gas simultaneously according to some embodiments of the present invention, wherein FIG. 5A is illustrated with a uniformity and FIG. 5B is illustrated with a specific resistance;

DETAILED DESCRIPTION OF EMBODIMENTS ACCORDING TO THE INVENTION

Figure 1A:
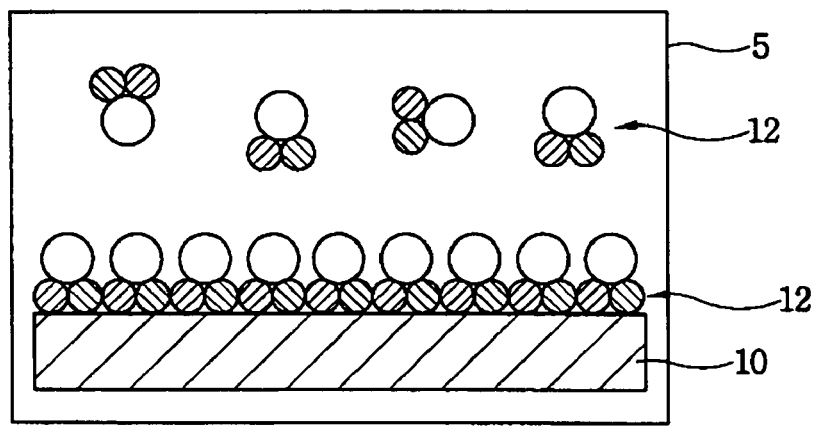
FIGS. 1A to 1D present cross-sectional views that illustrate reactions occurring on a substrate in an atomic layer deposition (ALD) process according to some embodiments of the present invention.

The present invention will now be described more fully herein with reference to the accompanying drawings, in which embodiments of the invention are shown. This invention may, however, be embodied in many different forms and should not be construed as being limited to the embodiments set forth herein. Rather, these embodiments are provided so that this disclosure will be thorough and complete and will fully convey the concept of the invention to those skilled in the art.

The terminology used in the description of the invention herein is for the purpose of describing particular embodiments only and is not intended to be limiting of the invention. As used in the description of the embodiments of the invention and the appended claims, the singular forms "a", "an" and "the" are intended to include the plural forms as well, unless the context clearly indicates otherwise.

Unless otherwise defined, all terms, including technical and scientific terms used in the description of the invention, have the same meaning as commonly understood by one of ordinary skill in the art to which this invention belongs. All publications, patent applications, patents, and other references mentioned herein are incorporated by reference in their entirety.

It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof.

Moreover, it will be understood that steps comprising the methods provided herein can be performed independently or at least two steps can be combined. Additionally, steps comprising the methods provided herein, when performed independently or combined, can be performed at the same temperature or at different temperatures without departing from the teachings of the present invention.

In the drawings, the thickness of layers and regions are exaggerated for clarity. It will also be understood that when a layer is referred to as being "on" another layer or substrate or a reactant is referred to as being introduced, exposed or feed "onto" another layer or substrate, it can be directly on the other layer or substrate, or intervening layers can also be present. However, when a layer, region or reactant is described as being "directly on" or introduced, exposed or feed "directly onto" another layer or region, no intervening layers or regions are present. Additionally, like numbers refer to like compositions or elements throughout.

As will be appreciated by one of skill in the art, the present invention may be embodied as compositions and devices as well as methods of making and using such compositions and devices.

A method of forming an atomic layer and a thin film by using an organic metal precursor or a tantalum halide precursor as a reacting material has been disclosed. According to methods disclosed in Korean Laid-Open Patent No. 2003-0009093 published on Jan. 29, 2003 (corresponding to U.S. patent application Ser. No. 10/196,814, filed Jul. 17, 2002), a gaseous phase reacting material is introduced into a chamber in which a substrate is placed. The introduced material is deposited by an atomic layer unit. An atomic layer including a metal element that has a low specific resistance at a relatively low temperature can be advantageously formed. However, there continues to be a desire for improved methods that require less complex process parameters.

In some embodiments of the present invention, methods of forming atomic layers according to the present invention comprise, consist essentially of or consist of introducing a tantalum amine derivative reactant onto a substrate, wherein the tantalum amine derivative has a formula: $Ta(NR_1)(NR_2R_3)_3$, wherein $R_1$, $R_2$ and $R_3$ are each independently H or a $C_1$–$C_6$ alkyl functional group, and thus, may be the same or different from each other, chemisorbing a portion of the reactant on the substrate, removing non-chemisorbed reactant from the substrate and introducing a reacting gas onto the substrate to form a solid material on the substrate. In some embodiments, the methods are carried out by a thermal atomic layer deposition (ALD) process or a radical assisted atomic layer deposition (RAALD) process using remote plasma. In further embodiments, the reactant can be provided in a liquid state. In particular embodiments, the reactant excludes a halogen component. In still other embodiments, the tantalum amine derivative can comprise tertiary amyl imido-tris-dimethylamido tantalum $(Ta(NC(CH_3)_2C_2H_5(N(CH_3)_2)_3)$. In still other embodiments, a portion of the reactant is chemisorbed on the substrate and the remaining part of the reactant is physisorbed on the substrate. The physisorbed reactant that is the non-chemisorbed reactant can be removed using an inert gas. The inert gas can comprise argon (Ar), helium (He), nitrogen ($N_2$) or a combination thereof. In some embodiments, the reacting gas can comprise hydrogen ($H_2$), ammonia ($NH_3$), silane ($SiH_4$) disilane ($Si_2H_6$) or a combination thereof. The reacting gas can further comprise activated hydrogen ($H_2$), activated ammonia ($NH_3$), activated silane ($SiH_4$) or activated disilane ($Si_2H_6$). Additionally, the activated reacting gas can be obtained by a remote plasma process. In some embodiments, the solid material formed can comprise tantalum nitride (TaN). In other embodiments, a solid comprising TaN can be formed on the substrate by introducing a reacting gas to remove a ligand-bonded element from the chemisorbed reactant. The ligand-bonded element can be removed using a compound that comprises $H_2$, $NH_3$, $SiH_4$ or $Si_2H_6$ or a combination thereof. In some embodiments, the compound can be activated by a remote plasma process. Activation by a remote plasma process may prevent damage to the substrate. In some embodiments, the methods can be carried out at a constant pressure in a range of about 0.3 Torr to about 30 Torr. In still other embodiments, the methods can be carried out at a constant pressure in a range of about 0.01 Torr to about 10 Torr. In further embodiments, the methods can be carried out at a constant pressure in a range of about 0.01 Torr to about 5 Torr. Additionally, in some embodiments, the methods can be carried out at a temperature in a range of about 100° C. to about 550° C. In other embodiments, the methods can be carried out at a temperature in a range of about 100° C. to about 450° C. In still other embodiments, the methods can be carried out at a temperature in a range of about 100° C. to about 350° C.

Methods for depositing atomic layers will be described with reference to the accompanying drawings. In particular, FIGS. 1A to 1D present cross sectional views illustrating methods of forming an atomic layer. Referring specifically to FIG. 1A, a substrate 10, such as monocrystalline silicon, is placed in a process chamber 5. The chamber 5 is then maintained at an appropriate pressure range and temperature range. Reactants 12 are introduced onto the substrate 10 placed within the chamber. As a result, the reactants 12 are chemisorbed on the substrate 10.

Figure 1B:
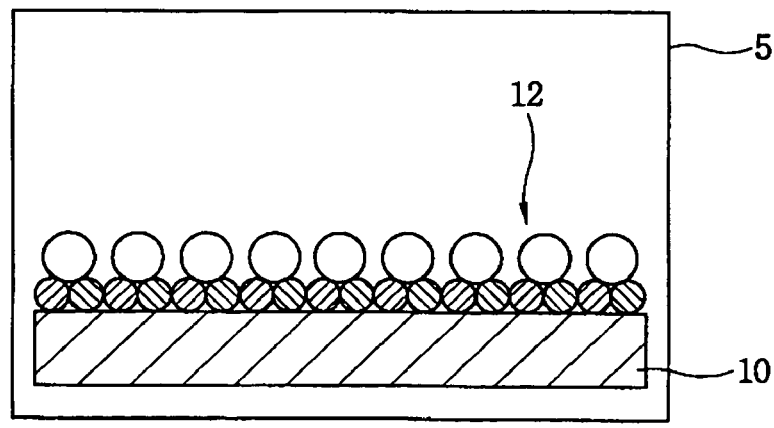

Referring to FIG. 1B, an inert gas is introduced onto the substrate to facilitate purging. As a result, the non-chemisorbed reactants 12 are removed from the substrate 10.

Figure 1C:
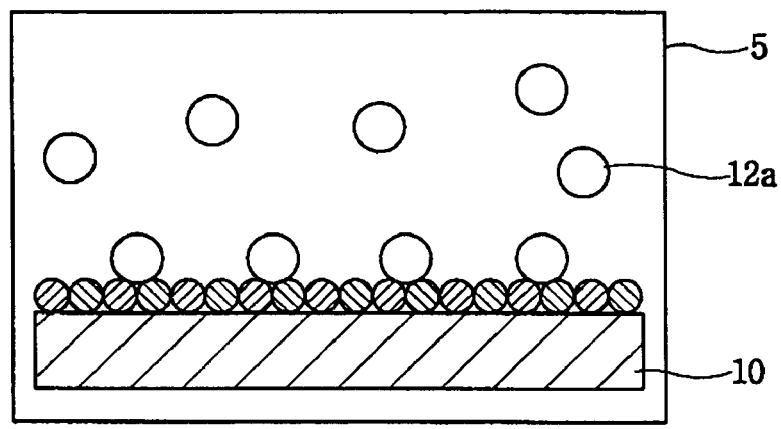

Referring to FIG. 1C, a reacting gas that comprises $H_2$, $NH_3$, $SiH_4$, $Si_2H_6$, or a combination thereof is introduced onto the substrate 10. In some embodiments, the reacting gas is introduced after activating the reacting gas using a remote plasma process.

Figure 1D:
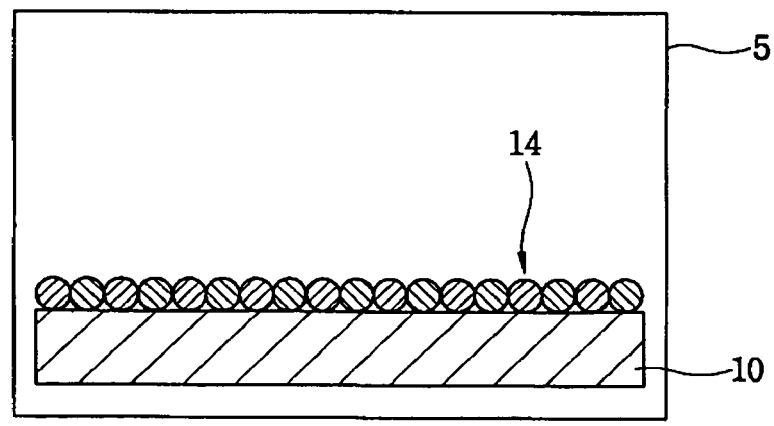

Referring to FIG. 1D, at least some of the ligand-bonded elements 12a included in the bonding elements of the chemisorbed reactants on the substrate 10 are removed by the reacting gas. The removal of the ligand-bonded elements 12a may be carried out by a ligand exchange between the ligand-bonded elements 12. The ligand-bonded elements are removed by the reacting gas because the reactive force of the reacting gas with respect to the ligand-bonded elements is greater than the bonding force of the ligand-bonded elements with respect to the chemisorbed reactants. Additionally, since Ta=N is a double-bonded structure, the bonding between Ta and N may not be affected by the reacting gas. Therefore, by removing the ligand-bonded elements, the atomic layer including Ta=N can be formed on the substrate. Thus, an atomic layer 14 comprising TaN is formed on the substrate 10.

Embodiments of the present invention further provide methods of forming thin films comprising, consisting essentially of or consisting of introducing a tantalum amine derivative reactant onto a substrate, wherein the tantalum amine derivative has a formula: $Ta(NR_1)(NR_2R_3)$, wherein, $R_1$, $R_2$ and $R_3$ are each independently H or a $C_1$–$C_6$ alkyl functional group and thus, may be the same or different from each other, chemisorbing a portion of the reactant on the substrate, removing non-chemisorbed reactant from the substrate, introducing a reacting gas onto the substrate to form a solid material including tantalum nitride (TaN) on the substrate and repeating steps (a) to (d) at least once to form a tantalum nitride (TaN) thin film including the solid material. In some embodiments, the steps can be repeated in sequence. In particular embodiments, the reactant excludes a halogen component. In other embodiments, the tantalum amine derivative can comprise tertiary amyl imido-tris-dimethylamido tantalum $(Ta(NC(CH_3)_2C_2H_5(N(CH_3)_2)_3)$ (TAIMATA). The reacting gas can comprise hydrogen ($H_2$), ammonia ($NH_3$), silane ($SiH_4$), disilane ($Si_2H_6$) or a combination thereof. The reacting gas can be introduced with an inert gas that comprises Ar, He, $N_2$ or combinations thereof. Thus, the non-chemisorbed reactant can be removed using an inert gas comprising Ar, He, $N_2$ or a combination thereof. Further, the reacting gas comprising $H_2$, $NH_3$, $SiH_4$, $Si_2H_6$ or a combination thereof can be activated using a remote plasma process. Moreover, forming layers in the methods of forming thin films can be carried out by a chemical vapor deposition (CVD) process, a thermal CVD process or a plasma enhanced CVD process. Additionally, the methods can be carried out at a constant pressure in a range of about 0.3 Torr to about 30 Torr. In still other embodiments, the methods can be carried out at a constant pressure in a range of about 0.01 Torr to about 10 Torr. In further embodiments, the methods can be carried out at a constant pressure in a range of about 0.01 Torr to about 5 Torr. Additionally, in some embodiments, the methods can be carried out at a temperature in a range of about 100° C. to about 550° C. In other embodiments, the methods can be carried out at a temperature in a range of about 100° C. to about 450° C. In still other embodiments, the methods can be carried out at a temperature in a range of about 100° C. to about 350° C.

As described in more detail with reference to the accompanying figures, methods of forming thin films according to the present invention employing an atomic layer deposition process can provide thin films having a relatively low specific resistance while being formed at a relatively low temperature. In particular, when the reacting gas is activated by a remote plasma process, a process parameter may be excluded due to the generation of plasma. Thus, the process may be carried out at a low temperature. Additionally, a TaN thin film can be advantageously formed by repeating the above-described atomic layer deposition process. Moreover, experiments were performed to compare tantalum amine derivatives comprising TAIMATA and conventionally known tantalum amine derivatives to confirm the suitability of TAIMATA. Such experiments were implemented with and without a reacting gas.

Figure 2:
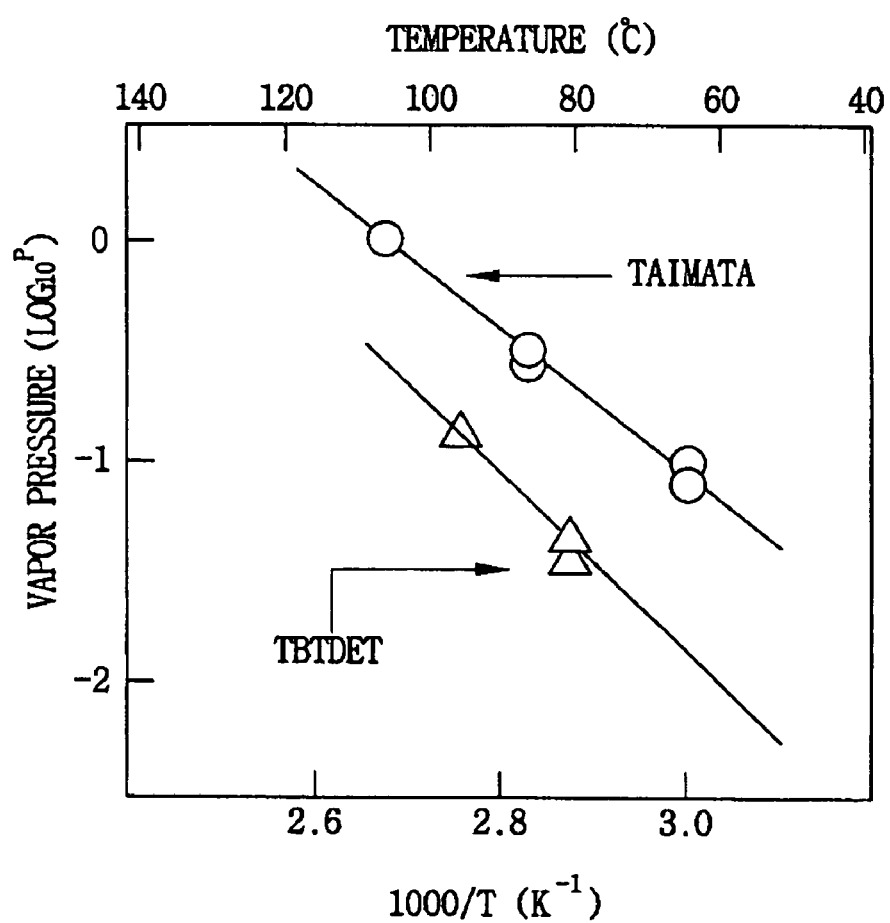
FIG. 2 presents a graph showing vapor pressures according to temperature for terbutylimido-tris-diethylamido-tantalum (TBTDET) and tertiary amyl imido-tris-dimethylamido tantalum (TAIMATA) used as a source when forming a tantalum nitride (TaN) thin film according to some embodiments of the present invention.

FIG. 2 presents a graph showing vapor pressures of the source for forming the TaN thin film, TBEDET and TAIMATA, according to temperature. In FIG. 2, the horizontal axis represents the temperature and the vertical axis represents the vapor pressure. FIG. 2 demonstrates that the vapor pressure of TAIMATA was higher than that of TBTDET at the same temperature.

Figure 3A:
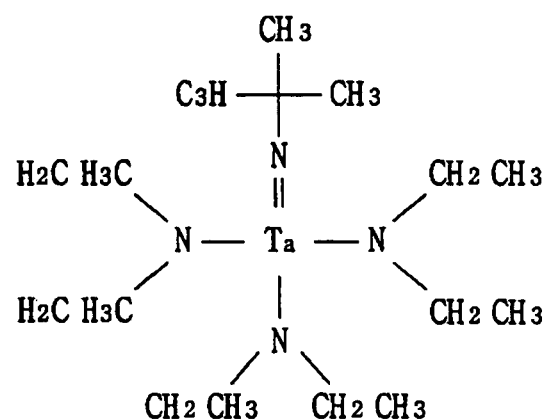
FIGS. 3A and 3B present the chemical formulas of TBTDET and TAIMATA used as a source when forming a TaN thin film according to some embodiments of the present invention.
Figure 3B:
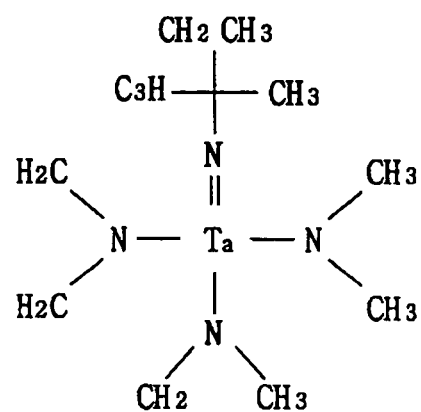

FIGS. 3A and 3B present the chemical formulae representing TBTDET and TAIMATA, which can be sources of forming a TaN thin film. FIG. 3A corresponds to TBTDET and FIG. 3B corresponds to TAIMATA. Both compounds can exclude any halogen elements such as chlorine, fluorine, bromine, and the like. However, the vapor pressure (Vp) of TBTDET is about 0.01 Torr at a temperature of about 60° C. and the phase thereof is a liquid state at room temperature. Alternatively, the vapor pressure (Vp) of TAIMATA is about 0.1 Torr at a temperature of about 60° C. Therefore, the vapor pressure of TAIMATA is about 10 times greater than that of TBTDET. In addition, the phase of TAIMATA is a solid state at room temperature. However, the melting point of TAIMATA is about 34° C., which is below 40° C. Therefore, when TAIMATA is heated to about 40° C., the phase of TAIMATA can be changed into a liquid state. Therefore, when TAIMATA is used in a deposition process, the problem of particle generation may be solved through slight heating. To deposit TaN using TAIMATA, various processes including CVD, PECVD, ALD, RAALD and the like are applicable. Reacting gases for forming TaN can comprise $NH_3$, $H_2$, $SiH_4$, $Si_2H_6$, and the like.

Figure 4A:
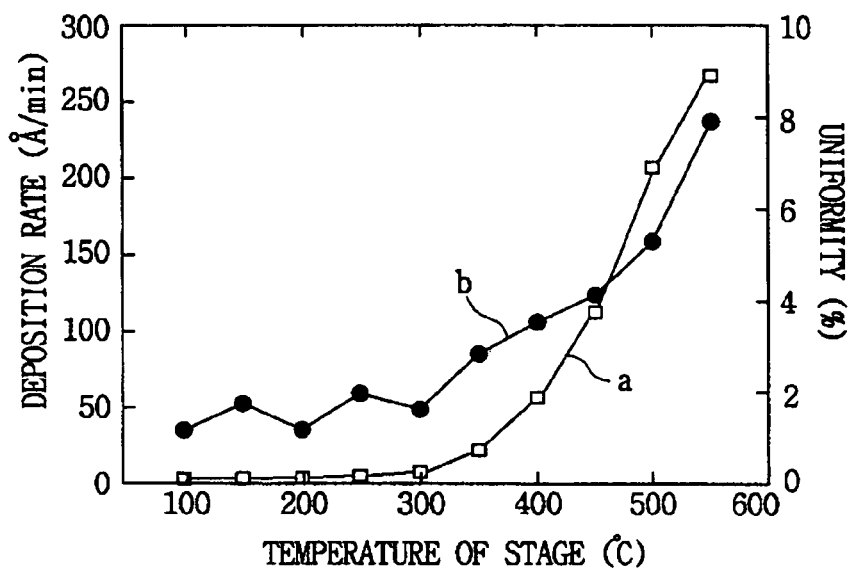
Figure 4B:
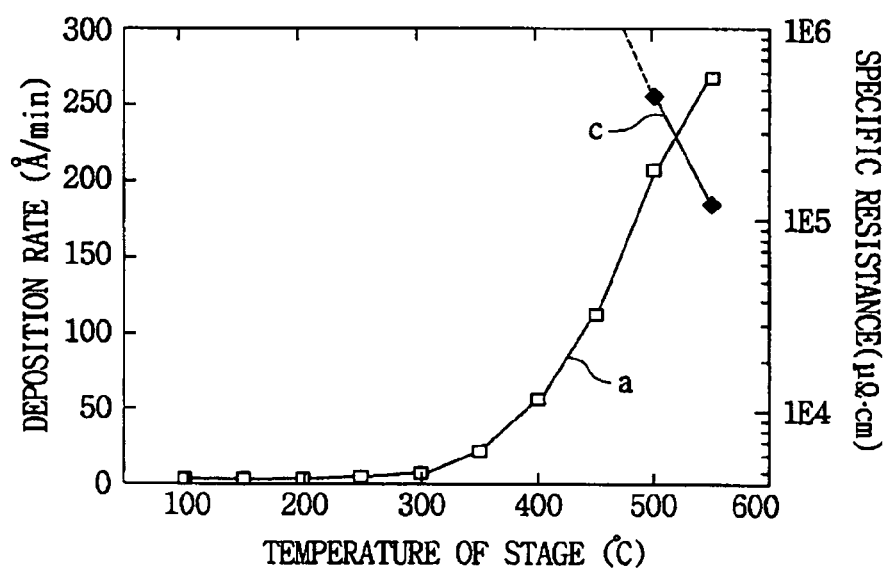

To examine the depositing characteristic of TAIMATA, a TaN deposition experiment was implemented by a CVD process under an Ar gas atmosphere. FIGS. 4A and 4B present graphs illustrating deposition rates according to the temperature of a stage heater during deposition of TAIMATA by a CVD process under the Ar gas atmosphere. FIG. 4A presents a graph showing a deposition rate according to the temperature of the stage heater along with uniformity and FIG. 4B presents a graph showing a deposition rate according to the temperature of the stage heater along with a specific resistance.

Referring to FIG. 4A, curved line 'a' represents deposition rate and curved line 'b' represents uniformity. TaN was deposited by the CVD process under the Ar atmosphere while the temperature of the stage heater was increased from about 100° C. to about 550° C. The deposition was started when the temperature of the substrate was about 300° C. or more. The deposition rate is directly proportional to an increase in temperature of the substrate. The decomposition temperature of TAIMATA confirmed by the experiment was about 300° C. According to experiments performed at a temperature range between about 300° C. to about 550° C., the deposition rate increased along with an increase of the deposition temperature. However, TAIMATA was not saturated. Therefore, the results suggest that the deposition rate was dependent on a surface reaction in the entire temperature range. In addition, the uniformity of the formed layer was improved as the deposition temperature increased.

FIG. 4B illustrates the specific resistance of the formed TaN layer measured by the above-described experiment. Curved line 'a' represents deposition rate and curved line 'c' represents specific resistance. Specifically referring to FIG. 4B, the specific resistance of the TaN layer formed by the CVD process without adding a reacting gas, was 400,000 Ωcm at a temperature of about 500° C., and 100,000 Ωcm at a temperature of about 550° C. The results suggest that the specific resistance decreased according to the increase of the deposition temperature.

Figure 5A:
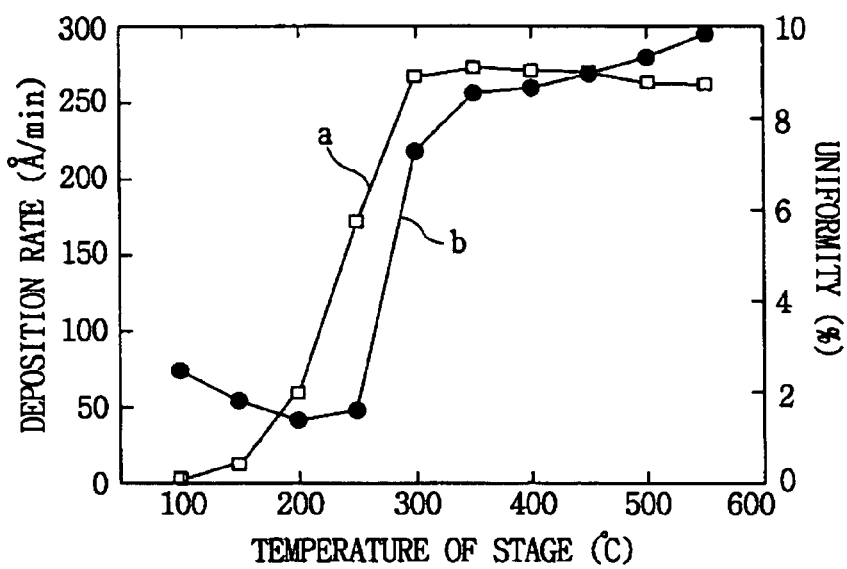
Figure 5B:
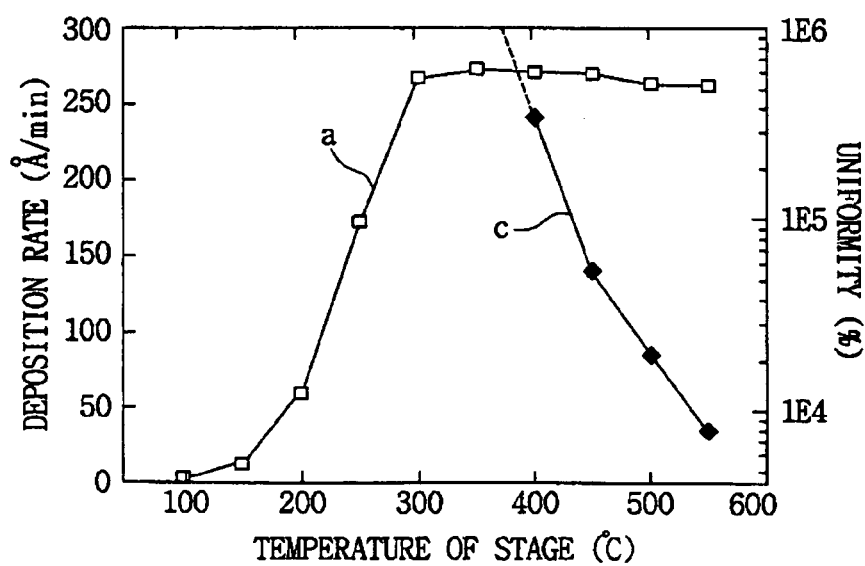

A deposition experiment was performed with a TAIMATA source along with a reacting gas. The TaN layer was formed by the CVD process while adding $NH_3$ as the reacting gas. The results are presented in FIGS. 5A to 5C. More specifically, FIGS. 5A and 5B present graphs illustrating deposition rates according to the temperature of a stage heater during deposition by the CVD process while applying a TAIMATA source along with $NH_3$ reacting gas. FIG. 5A presents a graph showing the deposition rate along with uniformity and FIG. 5B presents a graph showing the deposition rate along with a specific resistance.

Figure 5C:
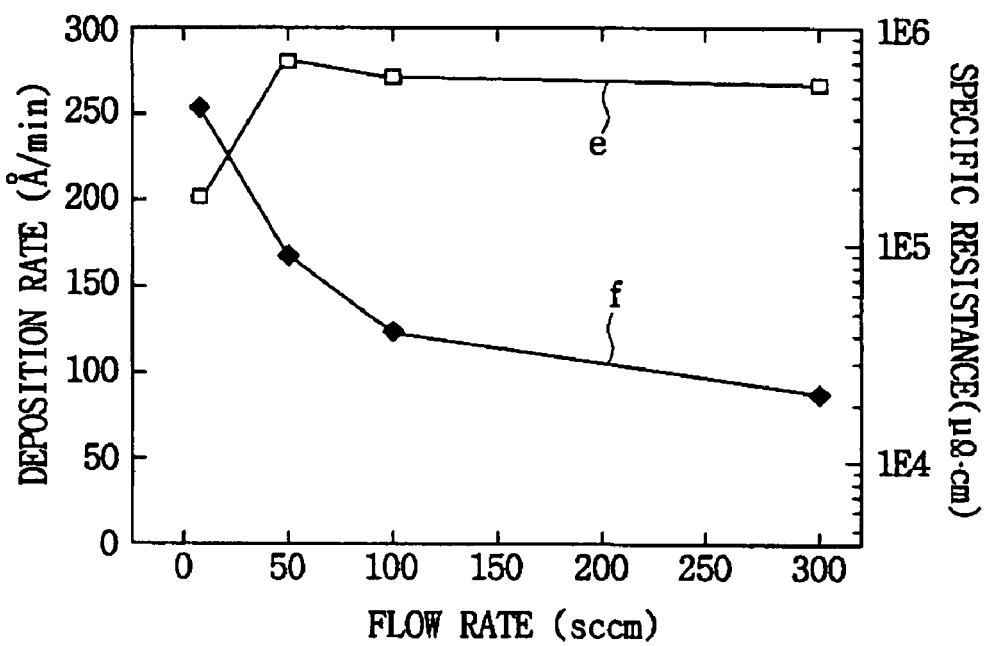
FIG. 5C presents a graph showing deposition rates with respect to the flowing amount of $NH_3$ during deposition of a TAIMATA source by a CVD process while supplying a $NH_3$ reacting gas simultaneously along with a specific resistance according to some embodiments of the present invention.

FIG. 5C presents graphs showing a deposition rate with a specific resistance according to the flowing amount of $NH_3$ during deposition of a TAIMATA source with $NH_3$ reacting gas by a CVD process.

Referring to FIG. 5A, the graph presenting the deposition rate as a function of temperature is illustrated. Curved line 'a' represents the deposition rate and curved line 'b' represents the uniformity. When TaN was deposited while increasing the temperature of the stage heater from about 100° C. to about 550° C., the deposition started at about 150° C. The deposition started at a lower temperature below about 300° C., which was the starting temperature of the deposition of TAIMATA without adding the reacting gas. The deposition rate increased within the temperature range of from about 150° C. to about 300° C. and the deposition rate was constant at the temperature range of from about 300° C. to about 550° C. This constant range is a mass transport regime. Based on the above-described experiment, a window region of an ALD temperature by the reaction of TAIMATA and $NH_3$ can be obtained in the region of from about 150° C. to about 300° C.

Referring to FIGS. 4A and 5A, the deposition rate at a temperature of about 300° C. was about 8.0 Å/min when using only TAIMATA, however, the deposition rate at a temperature of about 300° C. was about 270 Å/min when using TAIMATA with $NH_3$. Thus, the deposition rate increased by about 30 times when $NH_3$ was added as the reacting gas.

FIG. 5B presents results obtained after measuring the specific resistance of the TaN layer formed by the above-described experiment. Curved line 'a' represents the depositing rate and curved line 'c' represents the specific resistance.

Referring to FIG. 5B, the specific resistance of the TaN thin film formed by the CVD process using TAIMATA and $NH_3$ was 300,000 Ωcm at a temperature of about 400° C. The specific resistance rapidly decreased at a temperature of above about 450° C. and reached about 8,000Ωcm at a temperature of about 550° C. The results indicate that the specific resistance was greatly decreased as the depositing temperature increased.

FIG. 5C presents results obtained after measuring the deposition rate and the specific resistance according to the flowing amount of $NH_3$ by the CVD process at about 500° C. In FIG. 5C, curved line 'e' represents the deposition rate and curved line 'f' represents the specific resistance. The results indicate that the specific resistance decreased from about 400,000 Ωcm to about 20,000 Ωcm as the flowing amount of $NH_3$ increased.

Figure 6A:
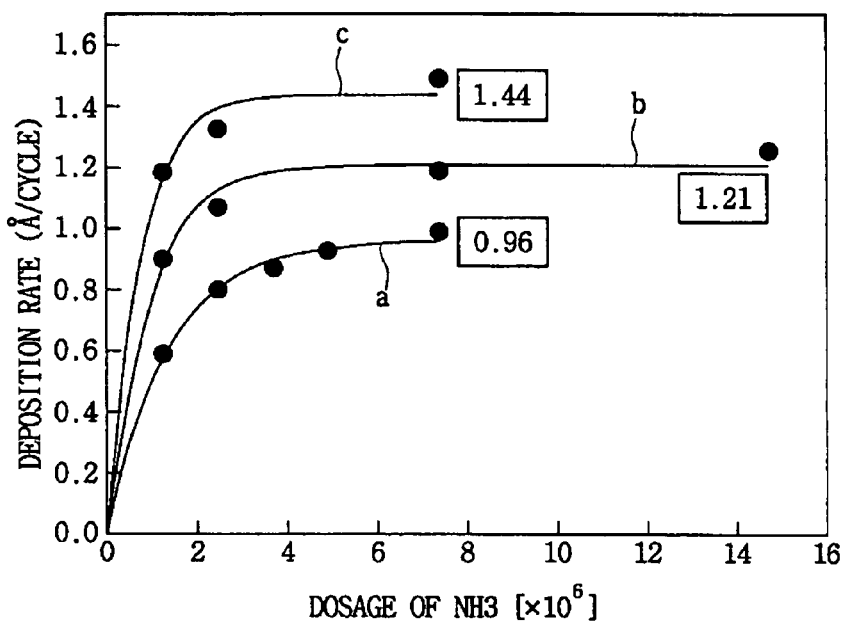
FIG. 6A presents a graph showing deposition rates according to the $NH_3$ dosage with changing temperature when depositing a TAIMATA source by an ALD process while supplying a $NH_3$ reacting gas simultaneously according to some embodiments of the present invention.
Figure 6B:
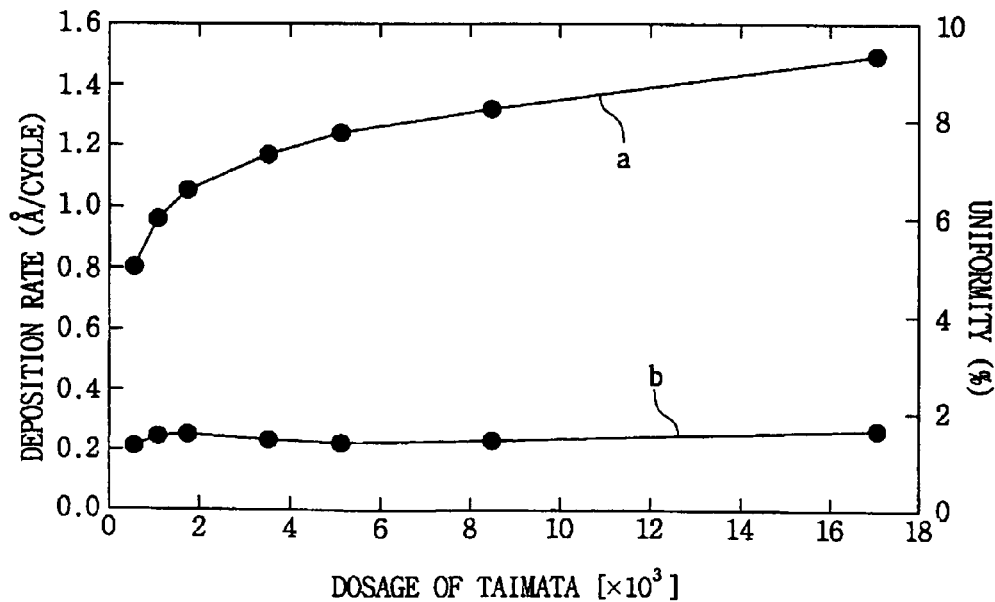
FIG. 6B presents a graph showing deposition rates according to the TAIMATA dosage when depositing a TAIMATA source by an ALD process while supplying a NH₃ reacting gas simultaneously according to some embodiments of the present invention.

A test of CVD-TaN deposition was performed using TAIMATA. The decomposition temperature of TAIMATA was at least about 300° C. and the ALD window region was in the temperature range of about 150° C. to about 300° C. The deposition characteristic of the ALD-TaN using TAIMATA and the reacting gas in the ALD window region was measured, and the behavior of the TaN deposition rate according to a dosage of $NH_3$ and TAIMATA was examined. The results are depicted in FIGS. 6A and 6B. More specifically, FIG. 6A presents graphs showing deposition rates according to dosage of $NH_3$ when deposition was performed by an ALD method while supplying a TAIMATA source with $NH_3$ reacting gas for several different temperatures.

FIG. 6B presents graphs showing deposition rate according to dosage of TAIMATA when deposition was performed by an ALD method while supplying a TAIMATA source with $NH_3$ reacting gas. The dosage is obtained by multiplying the partial pressure of the source and the pulsing time. A unit of the dosage is Langmuir (1 Langmuir=1E-6 Torr~sec). The applied TaN-ALD process is as follows. First, the gaseous phase TAIMATA precursor was introduced onto a substrate as the reactants. Through the introduction of the precursor, a portion of the reactants was chemisorbed on the substrate. An inert gas was then introduced onto the substrate to remove non-chemisorbed reactants from the substrate. One of $H_2$, $NH_3$, $SiH_4$, $Si_2H_6$ or a combination thereof was introduced onto the substrate to remove ligand-bonded elements included in the chemisorbed reactants to form a solid material including TaN. Through repeating the above-described steps at least once, and in some embodiments, in sequence, a TaN thin film was formed from the solid material.

Referring to FIG. 6A, the graphs illustrate the deposition rates according to the dosage of $NH_3$. Curved line 'a' corresponds to the temperature of the stage heater of 200° C., curved line 'b' corresponds to the temperature of the stage heater of 250° C. and curved line 'c' corresponds to the temperature of the stage heater of 300° C. The dosage of $NH_3$ was increased to about $8\times10^6$ by increasing the pulsing time of $NH_3$ at a temperature of about 200° C. The deposition rate increased when the dosage was below about $4\times10^6$, however, the deposition rate rapidly decreased when the dosage was above about $4\times10^6$. When the temperature of the stage heater increased to about 250° C., the deposition rate increased compared to the deposition rate at about 200° C. with the same dosage of $NH_3$. When additional experiments were performed by increasing the temperature of the stage heater to about 300° C., the deposition rate also increased by the same manner.

Referring to FIG. 6B, the graphs present the deposition rate according to the dosage of TAIMATA. Curved line 'a' represents the depositing rate and curved line 'b' represents the uniformity. From FIG. 6B, it can be noted that the deposition rate increased according to the increase of the amount of TAIMATA. It can further be noted that saturation was accomplished when the dosage of TAIMATA was at least about $2 \times 10^4$, while saturation is accomplished when the dosage of $NH_3$ is at least about $4 \times 10^6$.

Embodiments of the present invention further provide methods of forming thin films comprising, consisting essentially of or consisting of (a) forming an insulating layer on a substrate including therein an opening exposing a surface portion of the substrate, (b) introducing a tantalum amine derivative reactant onto the insulating layer having the opening, wherein the tantalum amine derivative has a formula: $Ta(NR_1)(NR_2R_3)$, wherein $R_1$, $R_2$ and $R_3$ are each independently H or a $C_1$–$C_6$ alkyl functional group and thus, may be the same or different from each other, (c) chemisorbing a portion of the reactant on the insulating layer having the opening, (d) removing non-chemisorbed reactant from the insulating layer having the opening, (e) introducing a reacting gas onto the substrate to form a solid material including tantalum nitride (TaN) on the substrate and (g) repeating steps (b) to (e) at least once to form a tantalum nitride (TaN) thin film on the insulating layer having the opening. In some embodiments, the steps are repeated in sequence. In other embodiments, the tantalum amine derivative can comprise tertiary amyl imido-tris-dimethylamido tantalum $(Ta(NC(CH_3)_2C_2H_5(N(CH_3)_2)_3)$. In particular embodiments, the reactant excludes a halogen component. In still other embodiments, the reacting gas can remove a ligand-bonded element from the chemisorbed reactant. The reacting gas can comprise $H_2$, $NH_3$, $SiH_4$, $Si_2H_6$ or a combination thereof. In some embodiments, the non-chemisorbed reactant is removed using an inert gas comprising Ar, He, $N_2$ or a combination thereof. In other embodiments, the opening has a large aspect ratio. An aspect ratio of the opening can be at least about 10:1. According to further embodiments of the present invention, these methods can be carried out at a temperature of about 100° C. to about 350° C. Repeatedly carrying out the above-described integration process, a TaN thin film having a predetermined thickness can be formed. The thickness of the thin film can vary according to the number of times the steps are repeated. Therefore, the thickness of the thin film may be controlled by adjusting the number of repetitions of the steps. Where the atomic layer integration method is utilized, a thin film having a desirable step coverage can be formed. Further, the TaN thin film can be advantageously formed on a multi-layered structure formed on a substrate as well as the insulating layer pattern having the opening.

Embodiments of the present invention further provide methods of forming thin films comprising, consisting essentially of or consisting of mixing a tantalum amine derivative having a formula: $Ta(NR_1)(NR_2R_3)$, wherein $R_1$, $R_2$ and $R_3$ are each independently H or a $C_1$–$C_6$ alkyl functional group and thus, may be the same or different from each other, with a reacting gas comprising $H_2$, $NH_3$, $SiH_4$, $Si_2H_6$ or a combination thereof to form a mixture, and depositing the mixture on a substrate. In some embodiments, the tantalum amine derivative can comprise tertiary amyl imido-tris-dimethylamido tantalum $(Ta(NC(CH_3)_2C_2H_5(N(CH_3)_2)_3)$. In particular embodiments, the reactant excludes a halogen component.

In other embodiments, depositing the mixture is performed by a chemical vapor deposition (CVD) process, a thermal chemical vapor deposition (CVD) process or a plasma enhanced chemical vapor deposition (PECVD) process. In still other embodiments, an inert gas can be mixed with the tantalum amine derivative. The inert gas can comprise Ar, He, $N_2$ or a combination thereof. In some embodiments, the reacting gas can comprise activated $H_2$, $NH_3$, $SiH_4$, $Si_2H_6$ or a combination thereof. The activated reacting gas can be obtained by a remote plasma process. In other embodiments, depositing the mixture can be carried out at a temperature of about 100° C. to about 550° C. In still other embodiments, depositing the mixture can be carried out at a temperature of about 150° C. to about 300° C. In particular embodiments, the thin film can comprise tantalum nitride (TaN).

Embodiments of the present invention further provide methods of forming thin films comprising, consisting essentially of or consisting of forming an insulating layer on a -substrate including therein an opening exposing a surface portion of the substrate and introducing a tantalum amine derivative as a reactant onto the insulating layer having the opening with a reacting gas comprising $H_2$, $NH_3$, $SiH_4$, $Si_2H_6$ or combinations thereof to form a tantalum nitride (TaN) thin film, wherein the tantalum amine derivative has a formula $Ta(NR_1)(NR_2R_3)$, wherein $R_1$, $R_2$ and $R_3$ are each independently H or a $C_1$–$C_6$ alkyl functional group and thus, may be the same or different from each other. In particular embodiments, the reactant excludes a halogen component.

In some embodiments, an inert gas comprising Ar, He, $N_2$ or a combination thereof can be additionally mixed with the reactant. In other embodiments, an aspect ratio of the opening is at least about 10:1. In further embodiments, the methods are performed at a temperature of about 100° C. to about 350° C.

Figure 7A:
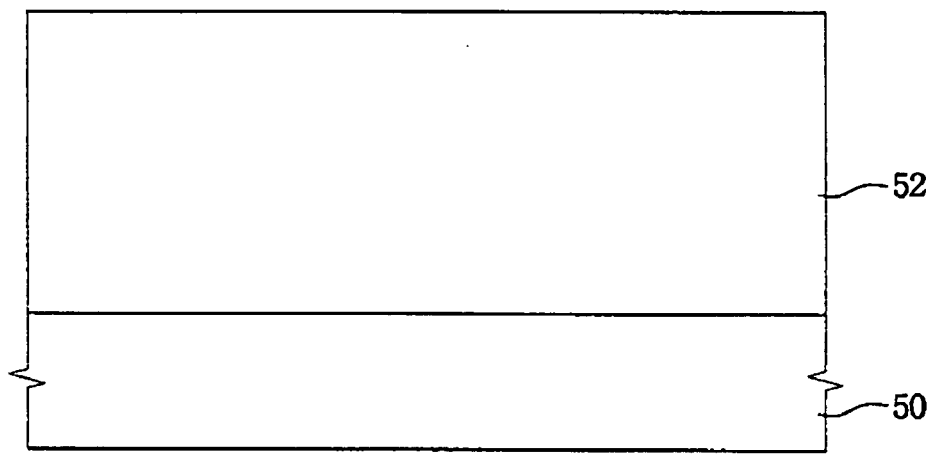
FIGS. 7A to 7C present cross-sectional views illustrating a method of forming a TaN thin film on an insulating layer having an opening according to some embodiments of the present invention.
Figure 7B:
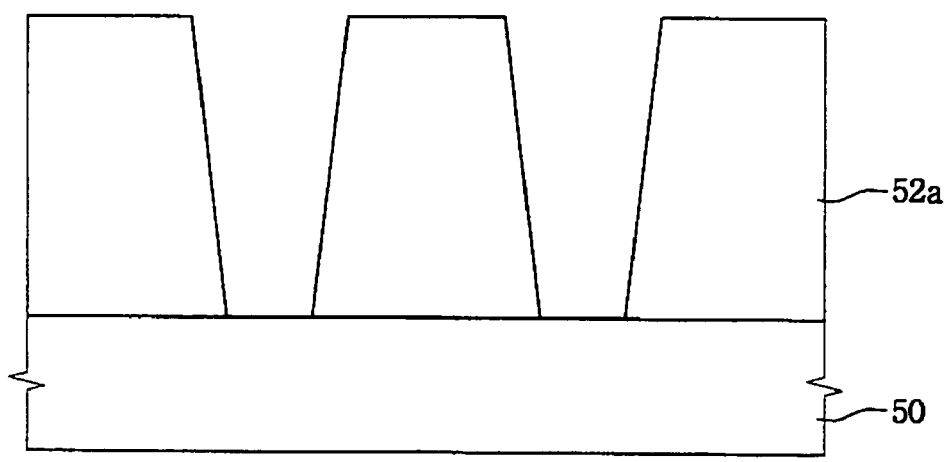
Figure 7C:
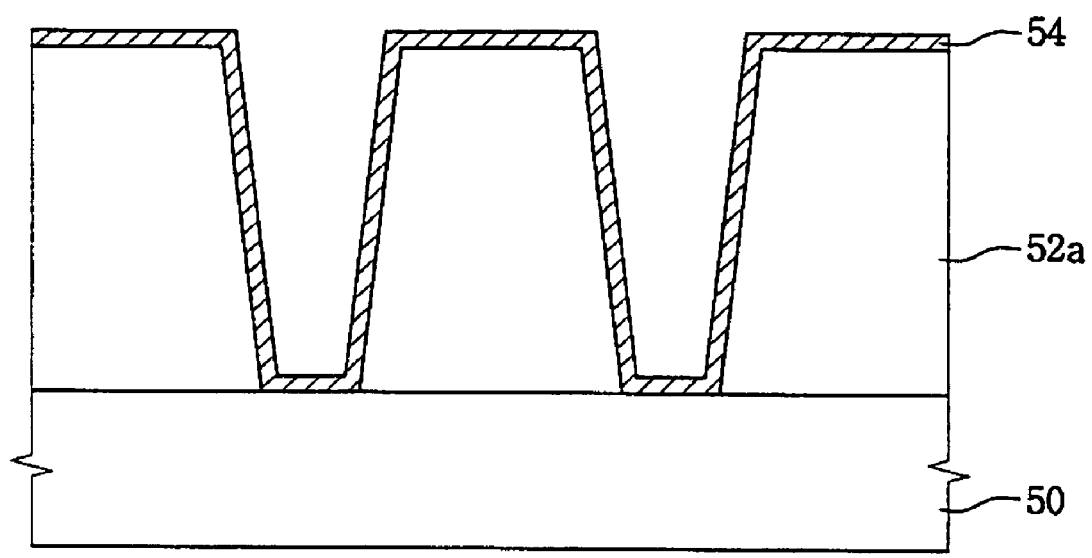

Methods of forming TaN thin films according to some embodiments of the present invention are described in more detail with reference to the accompanying figures. More specifically, FIGS. 7A to 7C present cross-sectional views illustrating methods of forming TaN thin films on an insulating layer having an opening portion and on a substrate. Referring to FIG. 7A, an insulating layer 52 including oxide can be formed on a substrate 50 such as a silicon substrate used in a semiconductor process. Referring to FIG. 7B, a portion of the insulating layer 52 is etched by a photolithography process to form an insulating layer pattern 52a including an opening having a predetermined aspect ratio. Referring to FIG. 7C, a TaN thin film 54 is formed on the insulating layer pattern 52a including the opening by an ALD-TaN process or a CVD-TaN process.

Figure 8:
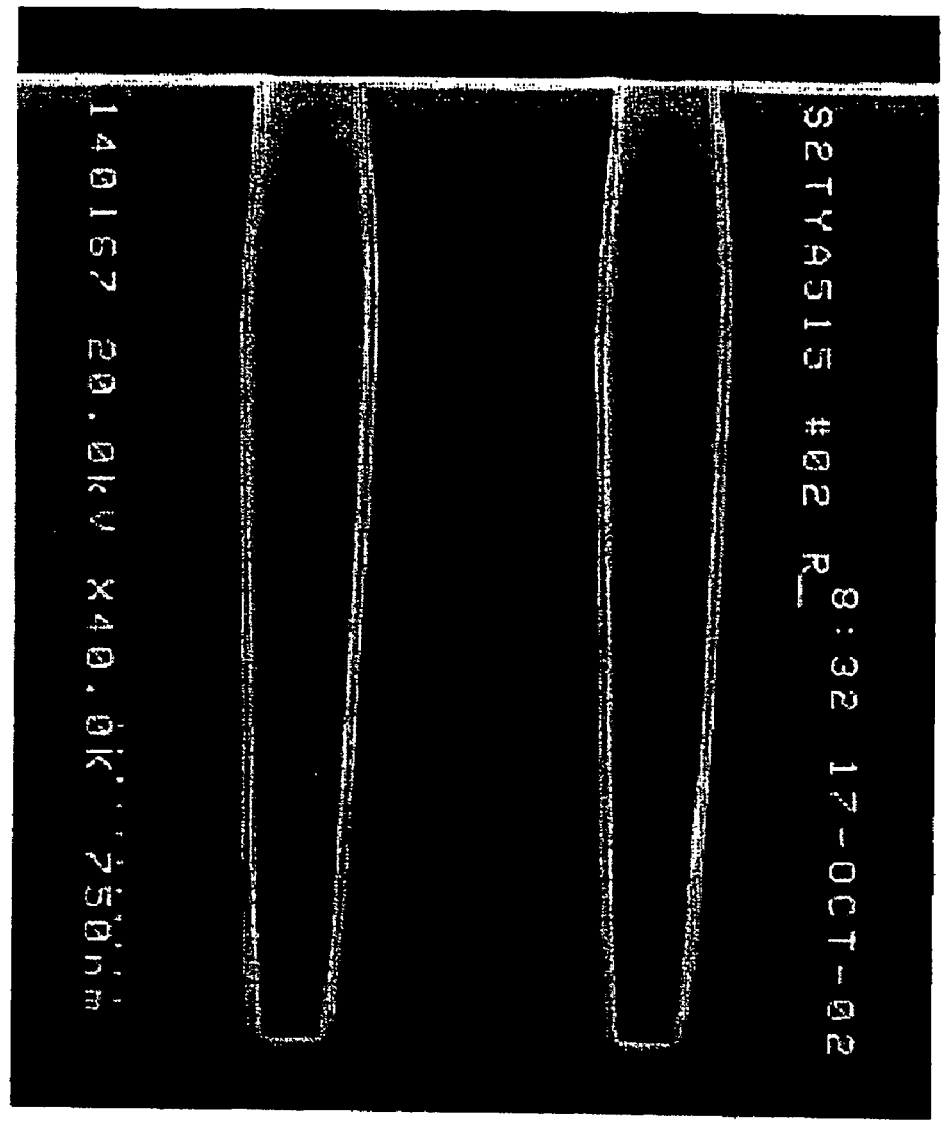
FIG. 8 presents a scanning electron microscope (SEM) picture showing a TaN thin film that is formed by an ALD process on an insulating layer having an opening that has a predetermined aspect ratio using a TAIMATA source with a NH₃ reacting gas according to some embodiments of the present invention.

FIG. 8 presents a scanning electron microscope (SEM) picture illustrating step coverage of the TaN thin film formed by depositing a TAIMATA source with an $NH_3$ reacting gas on an insulating layer having an opening with a predetermined aspect ratio by an ALD process. As a purging gas, a gas mixed of 1000 standard cubic centimeters per second (sccm) of hydrogen and 500 sccm of Ar was used and 100 sccm of Ar gas was used as a carrier gas of TAIMATA. The reacting gas, for example, $NH_3$, was injected at a flow rate of about 600 sccm. A thickness of both a top portion and a bottom portion of a contact hole was 250 Å, critical dimension (CD) of the top portion of the contact hole was about 250 nm, and the height of step was about 25,000 Å.

Therefore, the aspect ratio of the contact hole was about 10. The drawing suggests that the thin film exhibited a step coverage characteristic of near 100%.

A photograph illustrated in FIG. 8 corresponds to a photograph of the thin film formed by the ALD process. In order to compare characteristics of the thin films formed by the ALD-TaN process and the CVD-TaN process, thin films having a substantially same thickness were formed on the same target. Components of the thin films were analyzed. The results are provided in Table 1.

TABLE 1

|        | CVD-TaN | ALD-TaN |
|--------|---------|---------|
| Ta (%) | 31.9    | 36.2    |
| N (%)  | 36.5    | 54.7    |
| O (%)  | 24.8    | 5.6     |
| C (%)  | 6.8     | 3.5     |
| N/Ta   | 1.144   | 1.511   |

Table 1 shows that the impurity content of the thin film formed by the ALD process was low. When a deposition process was implemented using a TAIMATA source as described above, a TaN thin film having a desirable step coverage without particles could be formed with a high deposition rate.

Thin films may be formed by a process such as the CVD process or the ALD process. However, the thin film formed by the ALD process can exhibit superior characteristics.

Formation of thin films having desirable step coverage and a suitable gap-filling property can be accomplished by deposition processes according to embodiments of the present invention. In addition, the tantalum precursor used in some embodiments of the present invention can exclude halogen impurities and can be used in a liquid state. Therefore, the generation of particles in implementing the process may be reduced or prevented. Further, since vapor pressure of the precursor is high even at a low temperature, the deposition rate can remain acceptable. Consequently, improvement of the productivity and/or increase of the yield can be provided.

While the present invention is described in detail herein and further described with reference to the exemplary embodiments, it will be understood by those of ordinary skill in the art that various modifications, alternate constructions and equivalents may be employed without departing from the true spirit and scope of the present invention as defined by the following claims.

What is claimed is:

1. A method of forming an atomic layer comprising:
   introducing a tantalum amine derivative reactant onto a substrate, wherein the tantalum amine derivative comprises tertiary amyl imido-tris-dimethylamido tantalum ($Ta(NC(CH_3)_2 C_2H_5(N(CH_3)_2)_3$;
   chemisorbing a portion of the reactant on the substrate;
   removing non-chemisorbed reactant from the substrate; and
   introducing a reacting gas onto the substrate to form a solid material on the substrate, wherein the method is carried out by a thermal atomic layer deposition (ALD) process or a radical assisted atomic layer deposition (RAALD) process using remote plasma.

2. The method of claim 1, wherein the reactant is provided in a liquid state.

3. The method of claim 1, wherein the reactant excludes a halogen component.

4. The method of claim 1, wherein the non-chemisorbed reactant is removed using an inert gas.

5. The method of claim 4, wherein the inert gas comprises argon (Ar), helium (He), nitrogen ($N_2$) or a combination thereof.

6. The method of claim 1, wherein the reacting gas comprises hydrogen ($H_2$), ammonia ($NH_3$), silane ($SiH_4$) disilane ($Si_2H_6$) or a combination thereof.

7. The method of claim 1, wherein the reacting gas comprises activated hydrogen ($H_2$), activated ammonia ($NH_3$). activated silane ($SiH_4$) or activated disilane ($Si_2H_6$).

8. The method of claim 7, wherein the activated reacting gas is obtained by a remote plasma process.

9. The method of claim 1, wherein the reacting gas removes a ligand-bonded element from the chemisorbed reactant.

10. The method of claim 1, wherein the solid material comprises tantalum nitride (TaN).

11. The method of claim 1, wherein the method is carried out at a temperature of about 100° C. to about 350° C.

12. A method of forming a thin film comprising:
   (a) introducing a tantalum amine derivative reactant onto a substrate, wherein the tantalum amine derivative comprises tertiary amyl imido-tris-dimethylamido tantalum ($Ta(NC(CH_3)_2C_2H_5(N(CH_3)_2)_3$);
   (b) chemisorbing a portion of the reactant on the substrate;
   (c) removing non-chemisorbed reactant from the substrate;
   (d) introducing a reacting gas onto the substrate to form a solid material including tantalum nitride (TaN) on the substrate; and
   (e) repeating steps (a) to (d) at least once to form a tantalum nitride (TaN) thin film including the solid material.

13. The method of claim 12, wherein the steps are repeated at least once in sequence.

14. The method of claim 12, wherein the reactant excludes a halogen component.

15. The method of claim 12, wherein the reacting gas comprises hydrogen ($H_2$), ammonia ($NH_3$), silane ($SH_4$), disilane ($Si_2H_6$) or a combination thereof.

16. The method of claim 12, wherein the method is performed at a temperature of about 100° C. to about 350° C.

17. The method of claim 12, wherein the non-chemisorbed reactant is removed using an inert gas comprising argon (Ar), helium (He), nitrogen ($N_2$) or a combination thereof.

18. A method of forming a thin film comprising:
   (a) forming an insulating layer on a substrate including therein an opening exposing a surface portion of the substrate;
   (b) introducing a tantalum amine derivative as a reactant onto the insulating layer having the opening, wherein the tantalum amine derivative comprises tertiary amyl imido-tris-dimethylamido tantalum ($Ta(NC(CH_3)_2 C_2H_5(N(CH_3)_2)_3$);
   (c) chemisorbing a portion of the reactant on the insulating layer having the opening:
   (d) removing non-chemisorbed reactant from the insulating layer having the opening;
   (e) introducing a reacting gas onto the substrate to form a solid material including tantalum nitride (TaN); and
   (f) repeating steps (b) to (e) at least once to form a tantalum nitride (TaN) thin film on the insulating layer having the opening.

19. The method claim 18, wherein the reacting gas removes a ligand-bonded element from the chemisorbed reactant.

20. The method of claim 18, wherein the steps are repeated at least once in sequence.

21. The method of claim 18, wherein the reactant excludes a halogen component.

22. The method of claim 18, wherein the reacting gas comprises hydrogen ($H_2$), ammonia ($NH_3$), silane ($SiH_4$), disilane ($Si_2H_6$) or a combination thereof.

23. The method of claim 18, wherein the method is carried out at a temperature of about 100° C. to about 350° C.

24. The method of claim 18, wherein the non-chemisorbed reactant is removed using an inert gas comprising argon (Ar), helium (He), nitrogen ($N_2$) or a combination thereof.

25. The method of claim 18, wherein an aspect ratio of the opening is above about 10:1.

* * * * *